United States Patent [19]

Nakamura

[11] Patent Number: 5,177,373
[45] Date of Patent: Jan. 5, 1993

[54] PULSE WIDTH MODULATION SIGNAL GENERATING CIRCUIT PROVIDING N-BIT RESOLUTION

[75] Inventor: Yoshihito Nakamura, Yokohama, Japan

[73] Assignee: Kabushiki Kaisha Toshiba, Kawasaki, Japan

[21] Appl. No.: 766,398

[22] Filed: Sep. 27, 1991

[30] Foreign Application Priority Data

Sep. 28, 1990 [JP] Japan .................... 2-259090

[51] Int. Cl.$^5$ .............. H03K 5/04; H03K 3/284; H03K 7/00; H03K 17/00
[52] U.S. Cl. ................... 307/265; 307/269; 307/272.1; 328/58; 328/63; 328/72
[58] Field of Search ........... 307/265, 269, 529, 234, 307/272.1; 328/34, 58, 63, 72

[56] References Cited

U.S. PATENT DOCUMENTS

| | | | |
|---|---|---|---|
| 4,099,109 | 7/1978 | Abbondanti | 307/265 |
| 4,257,108 | 3/1981 | Igel | 307/265 |
| 4,599,569 | 7/1986 | Furuhata et al. | 307/265 |
| 4,675,545 | 6/1987 | Takahashi | 307/265 |
| 4,970,418 | 11/1990 | Masterson | 307/265 |

FOREIGN PATENT DOCUMENTS 2235103 2/1991 United Kingdom ........... 307/265

*Primary Examiner*—William L. Sikes
*Assistant Examiner*—Trong Phan
*Attorney, Agent, or Firm*—Finnegan, Henderson, Farabow, Garrett and Dunner

[57] ABSTRACT

A digital circuit includes a flip-flop for latching N-bit digital data for a predetermined period of time, a counter for cyclically counting N-bit binary data, a first adding circuit for adding n of LSBs of the N-bit digital data and n MSBs of the N-bit binary data and for generating first PWM data, and a second adding circuit for adding N-n MSBs of the N-bit digital data and N-n LSBs of the N-bit binary data and for generating second PWM data. The second adding circuit is capable of, in accordance with the first PWM data, adding on a time-divisional basis PWM data corresponding to a signal having a pulse width of T/2 (N−n) (T is a time period of one cycle) to second PWM data items which are generated by the second adding circuit.

3 Claims, 5 Drawing Sheets

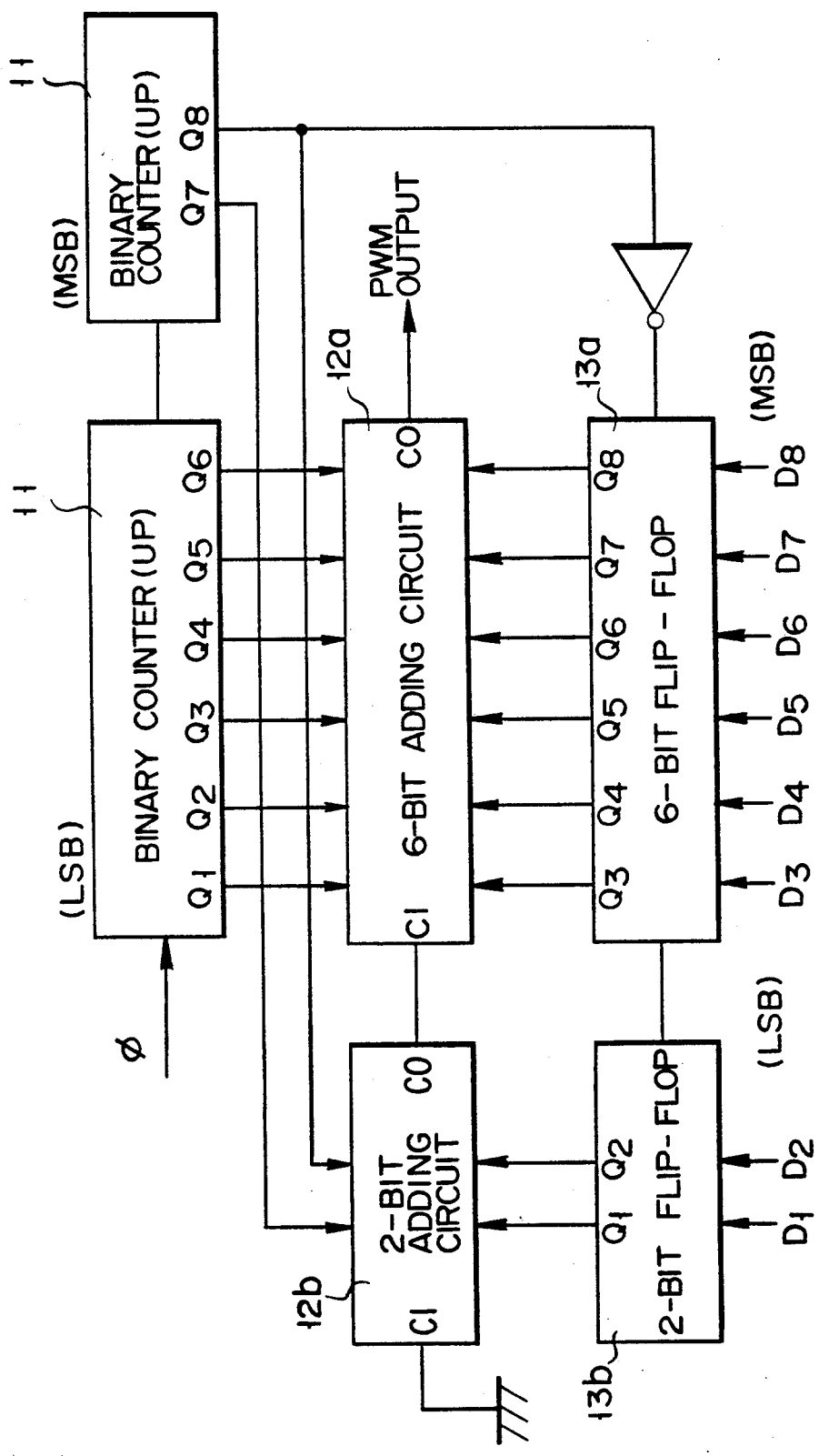
F I G. 2

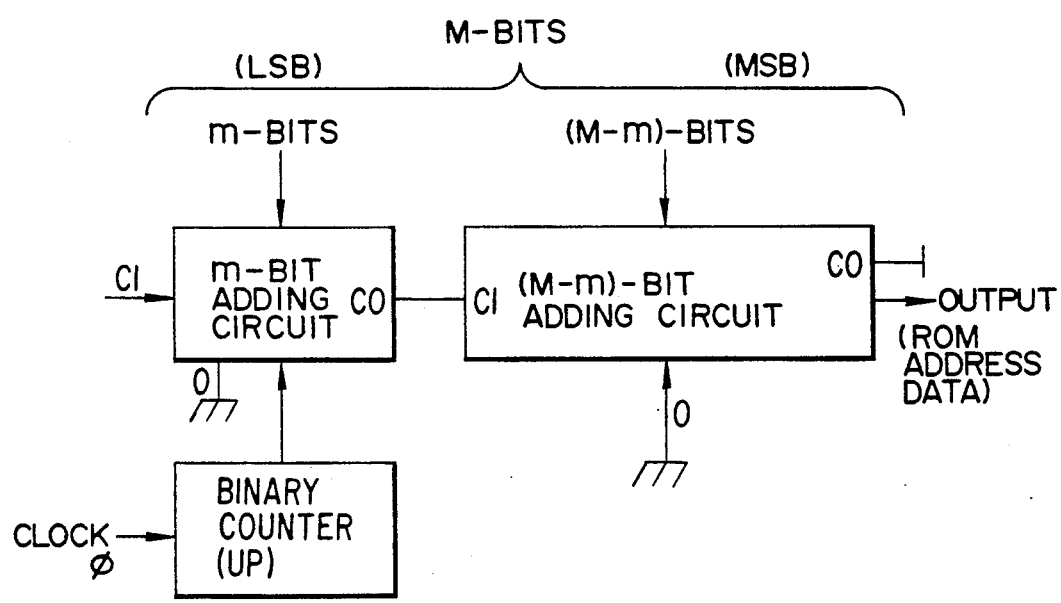
F I G. 5

PULSE WIDTH MODULATION SIGNAL GENERATING CIRCUIT PROVIDING N-BIT RESOLUTION

BACKGROUND OF THE INVENTION

1. Field of the Invention

The present invention relates to an improved digital circuit for controlling movement of the needle of a meter by supplying a PWM (Pulse Width Modulation) signal to a coil (load), for example.

2. Description of the Related Art

FIG. 1 shows a conventional PWM signal generating circuit. In FIG. 1, reference numerals 1, 2, and 3 respectively denote an N-bit binary counter, a comparing circuit, and an N-bit latch.

In the above PWM signal generating circuit, N-bit binary data which varies cyclically is output from the N-bit binary counter 1 to the comparing circuit 2. N-bit digital data is input to the N-bit latch 3 and is output therefrom to the comparing circuit 2. The N-bit binary data and the N-bit digital data are compared with one another by the comparing circuit 2, as a result of which a PWM signal is output therefrom.

In the case of driving the needle of a meter by supplying a PWM signal to a coil, that coil generates an audible sound when the frequency of the PWM signal is less than approximately 20 [kHz], and hence there is a demand for a PWM signal generating circuit which is capable of generating a PWM signal having a frequency of approximately 20 [kHz] or higher.

Let it be assumed that 8-bit digital data, for example, is input to the latch 3 in the conventional PWM generating circuit of FIG. 1. When the frequency of the PWM signal is set at approximately 20 [kHz], the minimum pulse width of the PWM signal is logically about 0.195 [μs]. However, it is actually impossible to operate the PWM signal generating circuit at a speed as high enough to generate a PWM signal having a pulse width of approximately 0.195 [μs], resulting in the aforementioned problem that the coil generates an audible sound.

Let it be assumed that 6-bit digital data, for example, is input to the latch 3 in the conventional PWM signal generating circuit of FIG. 1. When the frequency of the PWM signal is set at approximately 20 [kHz], the minimum pulse width of the PWM signal is logically about 0.781 [μs], which is four times greater than in the case of 8-bit digital data. However, use of digital data, comprised of a relatively small number of bits, e.g., 6 bits, incurs the problem that the resolution of the PWM signal output from the PWM signal generating circuit is low.

SUMMARY OF THE INVENTION

The present invention has been made in consideration of the above. An object of the present invention is to provide a digital circuit wherein an audible sound is not generated by the coil or wherein the audible sound generated by the coil is reduced in comparison to a conventional circuit, without reducing the resolution of the PWM signal, and without the need for operating the PWM signal generating circuit at high speed.

To achieve the above object, the digital circuit of the present invention includes a latch for latching N-bit digital data for a predetermined period of time, a counter for cyclically counting N-bit binary data, a first adding circuit for adding n LSBs (Least Significant Bits) of the N-bit digital data and n MSBs (Most Significant Bits) of the N-bit binary data and for generating first PWM data, and a second adding circuit for adding N−n MSBs of the N-bit digital data and N−n LSBs of the N-bit binary data and for generating second PWM data.

The above-mentioned second adding circuit is capable of, in accordance with the first PWM data, adding on a time-divisional basis PWM data corresponding to a signal having a pulse width of $T/2^{(N-n)}$ (T is a time period of one cycle) to second PWM data which are generated by the second adding circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a block diagram showing the PWM signal generating circuit according to one embodiment of the present invention;

FIG. 5 is a block diagram showing the ROM address control in FIG. 4.

DETAILED DESCRIPTION OF THE PREFERRED EMBODIMENTS

Figure 1:
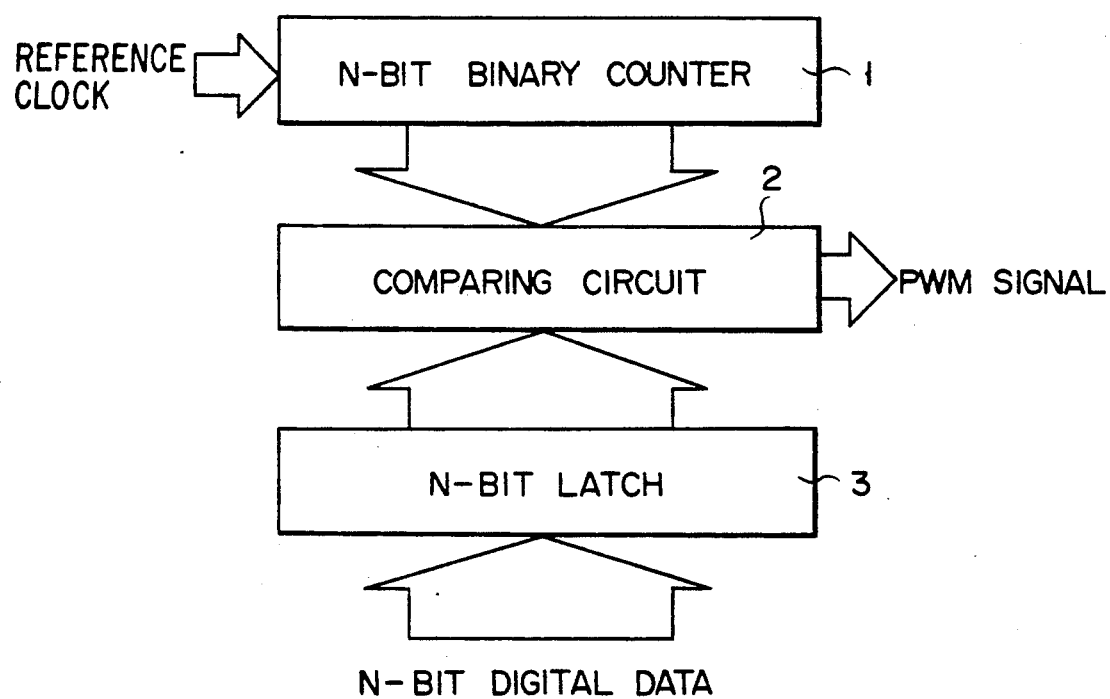
FIG. 1 is a block diagram showing a conventional PWM signal generating circuit.

One embodiment of the present invention will now be described in detail, with reference to the drawings.

FIG. 2 shows the PWM signal generating circuit according to one embodiment of the present invention. In FIG. 2, reference numeral 11 is a binary counter, numeral 12a is a 6-bit adding circuit, numeral 12b is a 2-bit adding circuit, numeral 13a is a 6-bit flip-flop, and numeral 13b is a 2-bit flip-flop.

The PWM signal generating circuit according to this embodiment generates a PWM signal having a minimum pulse width of 1 [μs] and a resolution of 256 (8 bits), and the cycle T of the PWM signal is 64 [μs]. In this embodiment, the 6 MSBs ($D_3$–$D_8$) of 8-bit digital data are input to the 6-bit adding circuit 12a. Of the data generated by the binary counter 11, which varies cyclically, the 6 LSBs ($Q_1$–$Q_6$) are also input to the 6-bit adding circuit 12a. The 6-bit adding circuit 12a adds the 6 MSBs ($D_3$–$D_8$) and the 6 LSBs ($Q_1$–$Q_6$), and generates a 6-bit PWM signal as a result. The 2 MSBs ($Q_7$, $Q_8$), which vary in a cycle four times longer than the cycle T of the PWM signal (the cycle in which the 6 LSBs of the data generated by the binary counter 11 vary), are input to the 2-bit adding circuit 12b. The 2 LSBs ($D_1$, $D_2$) of the 8-bit digital data which are not used to generate the 6-bit PWM signal are also input to the 2-bit adding circuit 12b. The 2-bit adding circuit 12b adds the 2 MSBs ($Q_7$, $Q_8$) and the 2 LSBs ($D_1$, $D_2$), and as a result generates a PWM (time-division) signal CI, which is input to the 6-bit adding circuit 12a. In accordance with the PWM signal CI, the 6-bit adding circuit 12a adds a PWM signal having a minimum pulse width of 1 [μs] to the 6-bit PWM signal. The PWM signal, which is output from the 6-bit adding circuit 12a after the addition, is supplied to a load (not shown) and is integrated thereby, as a result of which the resolution of the PWM signal becomes approximately 256 (8 bits).

Figure 3:
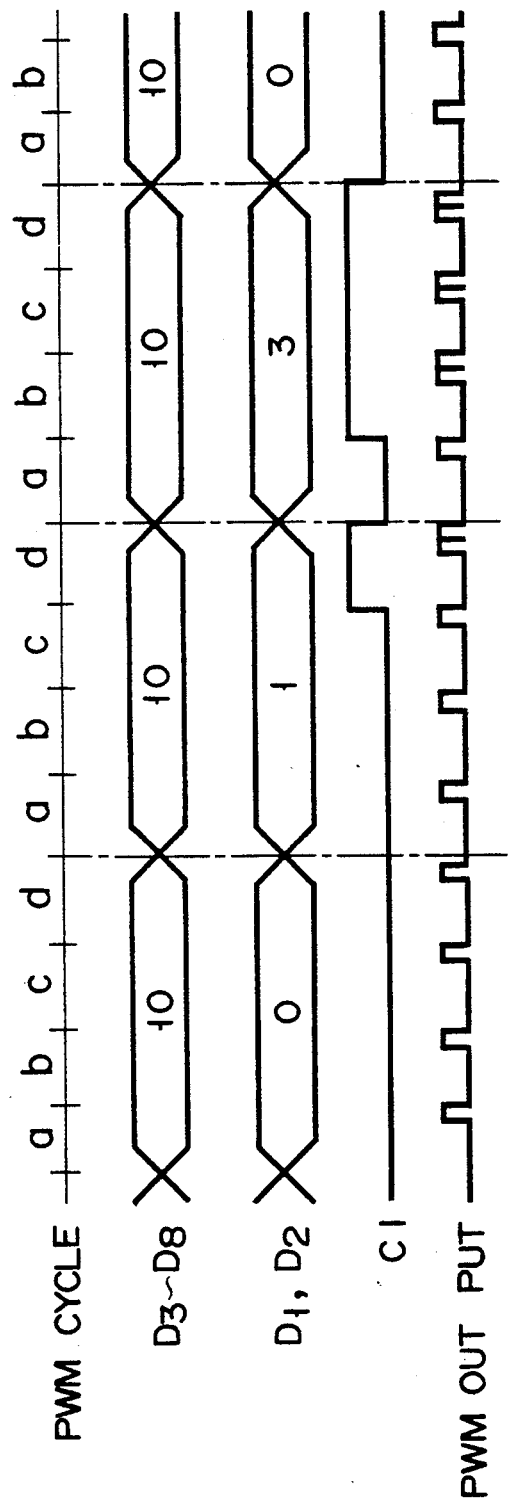
FIG. 3 is a waveform chart showing the basic operation of the PWM signal generating circuit of FIG. 1.

Operation of the aforementioned PWM signal generating circuit will now be explained in detail, with reference to FIG. 3.

The 8-bit digital data is divided into the 2 LSBs ($D_1$, $D_2$) and the 6 MSBs ($D_3$–$D_6$), and PWM signal pulses which are output from the 6-bit adding circuit 12a are averaged every four cycles (a to d). In general, when N-bit digital data is divided into the n LSBs and the N−n MSBs, PWM signal pulses are averaged every $n^2$ cycles.

The 6-bit adding circuit 12a outputs a PWM signal having a minimum pulse width of T/64 [μs], provided that one cycle is T [μs]. For example, when $D_3$–$D_8$ indicate 10, the 6-bit adding circuit 12a outputs a PWM signal having a pulse width of 10T/64 [μs]. Generally speaking, an (N−n)-bit adding circuit outputs a PWM signal having a minimum pulse width of $T/2^{(N-n)}$ [μs].

For example, when $D_1$ and $D_2$ indicate 1, a PWM signal CI rises at the beginning of cycle d, as a result of which a PWM signal pulse having a width of T/64 [μs] is added to the PWM signal pulse output in cycle d, such that the width of the PWM signal pulse output in cycle d becomes 11T/64. In this case, the time-based average of the PWM signal pulses output in cycles a to d is given by:

$$\frac{\frac{10}{64} \times 3 + \frac{11}{64}}{4} T = \frac{41}{256} T \,[\mu s]$$

Therefore, when the load (not shown) is a coil, for example, the PWM signal to be output from the PWM signal generating circuit has a resolution of approximately 256 (8 bits). Generally speaking, an (N−n)-bit adding circuit adds a PWM signal pulse having a width of $T/2^{(N-n)}$ [μs] to the PWM signal pulse output in cycle d, so as to provide the PWM signal with a resolution of approximately $2^N$ (N bits).

When $D_1$ and $D_2$ indicate 0, for example, the PWM signal CI has 0 level, with the result that no signal pulses are added to PWM signal pulses which are output in cycles a to d. In this case, the time-based average of the PWM signal pulses output in cycles a to d is given by:

$$\frac{\frac{10}{64} \times 4}{4} T = \frac{10}{64} T = \frac{40}{256} T \,[\mu s]$$

When $D_1$ and $D_2$ indicate 3, for example, the PWM signal CI rises at the beginning of cycle b, as a result of which a PWM signal pulse having a width of T/64 [μs] is added to each of the PWM signal pulses which are output in cycles b, c, and d, such that the width of each of the PWM signal pulses output in cycles b, c, and d becomes 11T/64. In this case, the time-based average of the PWM signal pulses output in cycles a to d is represented by:

$$\frac{\frac{10}{64} + \left(\frac{11}{64} \times 3\right)}{4} T = \frac{43}{256} T \,[\mu s]$$

Thus, an (N−n)-bit adding circuit has the function of adding a PWM signal having a minimum pulse width of $T/2^{(N-n)}$ [μs] to an (N−n)-bit PWM signal. If the pulses of the (N−n)-bit PWM signal are averaged every $2^n$ cycles, the resolution thereof will become approximately $2^N$.

In addition, the cycle T of the PWM signal is proportional to the number of LSBs of the data generated by the binary counter 11. In this embodiment, since the number of LSBs of the data generated by the binary counter 11 is six, the cycle of the PWM signal and the cycle in which the above 6 LSBs vary are equal to each other. Further, according to this embodiment, the PWM signal is integrated by a load (not shown), e.g., a coil, as a result of which the resolution of the PWM signal becomes 256 (8 bits).

Thus, according to the present invention, a PWM signal having a satisfactory high frequency can be obtained, without the resolution thereof being decreased below that of the PWM signal generated by a conventional circuit. To be specific, in the present invention, the frequency of the PWM signal is $2^2$ (4) times higher than that of the PWM signal generated by a conventional circuit, enabling the audible sound to be reduced over a conventional circuit or preventing the audible sound from being generated. For example, when the number of bits is eight and a reference clock is 1 [μs], the frequency of the PWM signal generated by a conventional circuit is represented by:

$$\frac{1}{10^{-6} \times 2^8} \simeq 3.9 \text{ kHz}$$

In contrast, the frequency of the PWM signal of the present invention is represented by:

$$\frac{1}{10^{-6} \times 2^6} \simeq 15.6 \text{ kHz}$$

According to the present invention, as can be seen from the above, it is possible to increase the frequency of the PWM signal to $2^2$ (4) times that of the PWM signal generated by a conventional circuit, and the resolution of the PWM signal does not decrease below that of the PWM signal generated by a conventional circuit. Therefore, the present invention can be employed in a high resolution apparatus.

Figure 4:
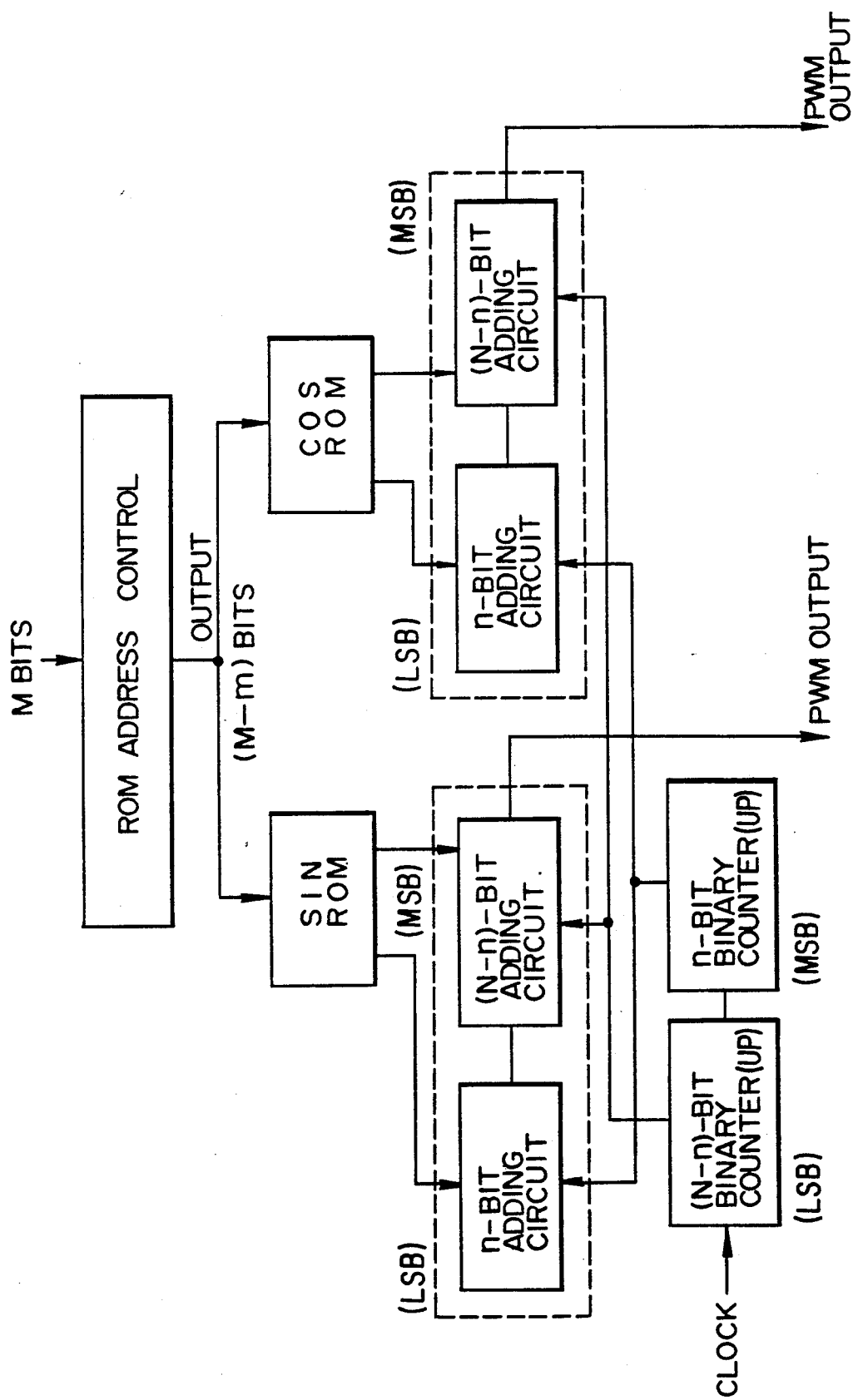
FIG. 4 is a block diagram showing the digital circuit according to another embodiment of the present invention.

FIG. 4 shows an example wherein the present invention is employed in converting M-bit SIN and COS data into (M−m)-bit PWM data. In FIG. 4, the PWM signal generating circuit shown in FIG. 2 is indicated by broken lines.

Generally speaking, data such as SIN and COS (digital) data which is comprised of a relatively large number of bits and is depicted as substantially a curve in a graph, can be converted into PWM data having only a small number of errors. However, if the number of bits is large, use of a correspondingly large-sized ROM will be required. A small-sized ROM can be used if a ROM address controlling unit is operated to perform a control such as to decrease the number of bits of a ROM address by performing time-division of the ROM address within a time period which is $2^n$ longer than the cycle of the PWM signal. However, if the number of bits of the ROM address is thus decreased, the amount of SIN and COS data conversion errors will be considerable. Using the PWM signal generating circuit of the present invention as shown in FIGS. 4 and 5 eliminates the above problems.

Referring now to FIG. 5, m bits of the LSBs of M-bit ROM address data and m bits of the MSBs of M-bit binary data are input to an m-bit adding circuit. Further, (M−m) bits of the MSBs of the M-bit ROM address data are input to an (M−m)-bit adding circuit.

In this ROM address control, M-bit ROM address data is converted into (M−m)-bit ROM address data. This feature allows the SIN ROM and the COS ROM to be reduced in size, without decreasing the resolution of the ROM address data.

In addition, FIG. 5, shows the ROM address control shown in FIG. 4.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A digital circuit for providing an N-bit resolution even when N-bit digital data is decreased to N−n bit digital data (N and n are positive integers and N>n), said digital circuit comprising:
   means for latching N-bit digital data for a predetermined period of time;
   means for cyclically counting N-bit binary data;
   a first adding circuit connected to means for latching and means for cyclically counting for adding n least significant bits of the N-bit digital data and n most significant bits of the N-bit binary data and for generating first pulse width modulation data; and
   a second adding circuit for adding N−n most significant bits of the N-bit digital data and N−n least significant bits of the N-bit binary data and for generating second pulse width modulation data;
   wherein said second adding circuit is capable of, in accordance with said first pulse width modulation data, adding on a time-divisional basis pulse width modulation data corresponding to a signal having a pulse width of $T/2^{(N-n)}$ (T is a time period of one cycle) to said second pulse width modulation data which are generated by said second adding circuit.

2. The digital circuit according to claim 1, wherein said second pulse width modulation data, which are generated by said second adding circuit in the period from the first cycle to the $(2^n)$th cycle, are averaged on a time basis.

3. The digital circuit according to claim 1, wherein said N-bit digital data is output from a ROM.

* * * * *

UNITED STATES PATENT AND TRADEMARK OFFICE
CERTIFICATE OF CORRECTION

PATENT NO. : 5,177,373
DATED : January 05, 1993
INVENTOR(S) : Yoshihito Nakamura It is certified that error appears in the above-identified patent and that said Letters Patent is hereby corrected as shown below:

Abstract, Title Page, Line 13, change "T/2(N-n) to --$T/2^{(N-n)}$--.

Claim 1, column 6, line 2, change "is" to --are--.

Claim 3, column 6, line 30, change "is" to --are--.

Signed and Sealed this

First Day of March, 1994

Attest:

BRUCE LEHMAN

Attesting Officer  Commissioner of Patents and Trademarks